(12) United States Patent
Kuroi et al.

(10) Patent No.: US 6,890,837 B2
(45) Date of Patent: May 10, 2005

(54) METHOD OF MANUFACTURING SEMICONDUCTOR DEVICE INCLUDING STEPS OF FORMING BOTH INSULATING FILM AND EPITAXIAL SEMICONDUCTOR ON SUBSTRATE

(75) Inventors: Takashi Kuroi, Tokyo (JP); Katsuyuki Horita, Tokyo (JP); Katsuomi Shiozawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/683,359

(22) Filed: Oct. 14, 2003

(65) Prior Publication Data

US 2004/0082165 A1 Apr. 29, 2004

Related U.S. Application Data

(62) Division of application No. 10/212,249, filed on Aug. 6, 2002, now Pat. No. 6,737,315.

(30) Foreign Application Priority Data

Sep. 20, 2001 (JP) .......................................... 2001-286920

(51) Int. Cl.[7] .............................................. H01L 21/46
(52) U.S. Cl. .......................... 438/462; 438/401; 257/797
(58) Field of Search ................................ 438/462, 401; 257/797

(56) References Cited

U.S. PATENT DOCUMENTS 5,930,620 A    7/1999  Wristers et al.
6,452,246 B1   9/2002  Komori
6,506,661 B1   1/2003  Chang et al.
6,617,702 B2 * 9/2003  Hsu et al. .................... 257/797
6,706,547 B2 * 3/2004  Sakamoto et al. ............ 438/33

FOREIGN PATENT DOCUMENTS

JP    59-129439        7/1984
JP    09-148426        6/1997
JP    2000-100931 A    7/2000

* cited by examiner

*Primary Examiner*—Dung A. Le
(74) *Attorney, Agent, or Firm*—Oblon, Spivak, McClelland, Maier & Neustadt, P.C.

(57) ABSTRACT

A substrate surface (10S) is thermally oxidized to form an oxide film. The oxide film is patterned so that the substrate surface (10S) in an active region is exposed. An oxide film (20) is thereby provided. An exposed substrate surface (10S) is thermally oxidized, to form a thermal oxide film. This thermal oxide film is thereafter removed at least in an element forming region. A silicon film (41) is epitaxially grown on the exposed substrate surface (10S). Thereafter the silicon film (41) is polished by CMP to an extent that an upper surface of the silicon film after polishing is not more than an upper surface of the oxide film (20) in height. Next, the surface of the silicon film is thermally oxidized to form a thermal oxide film. After ion implantation of various types, this thermal oxide film is removed.

3 Claims, 13 Drawing Sheets

<THERMAL PROCESSING IN ATMOSPHERE INCLUDING HYDROGEN>

METHOD OF MANUFACTURING SEMICONDUCTOR DEVICE INCLUDING STEPS OF FORMING BOTH INSULATING FILM AND EPITAXIAL SEMICONDUCTOR ON SUBSTRATE

This application is a divisional of application Ser. No. 10/212,249, (filed Aug. 6, 2002) now U.S. Pat. No. 6,737,315 and claims the benefit of priority from the prior Japanese Patent Application No. 2001-286920, (filed Sep. 20, 2001), each of which is incorporated herein by reference.

BACKGROUND OF THE INVENTION

1. Field of the Invention

The present invention relates to a method of manufacturing a semiconductor device allowing improvement in yield.

2. Description of the Background Art

In a semiconductor integrated circuit, when diverse elements should operate in a totally independent manner without electrical interaction thereamong, it is required to provide an element isolation structure having an element isolation region.

A well-known technique of forming an element isolation region is trench isolation, on which several improvements have been suggested. According to the trench isolation technique, a trench is defined in a substrate and then filled with an insulating material. Trench isolation offers little probability of bird's beak and therefore, is recognized as one of the essential techniques of element isolation allowing shrinkage of a semiconductor integrated circuit.

A background-art method of manufacturing a semiconductor device will be described with reference to sectional views of FIGS. 24 through 28. First, a silicon oxide film 221P and a silicon nitride film 222P are stacked in this order on a silicon substrate 10P. Next, the silicon nitride film 222P, the silicon oxide film 221P and the substrate 10P are sequentially patterned using a photolithography pattern as a mask, to define a trench 11P in the substrate 10P (see FIG. 24). Following this, an inner wall of the trench 11P is thermally oxidized, to form an inner wall oxide film 223P. Thereafter a buried oxide film 21P is entirely deposited by CVD (chemical vapor deposition) (see FIG. 25).

Next, following CMP (chemical mechanical polishing) using the silicon oxide film 221P as a stopper, the buried oxide film 21P is removed in the area defined on the nitride film 222P. The buried oxide film 21P is thereafter planarized, to form a buried oxide film 20P in the trench 11P (see FIG. 26).

Figure 27:
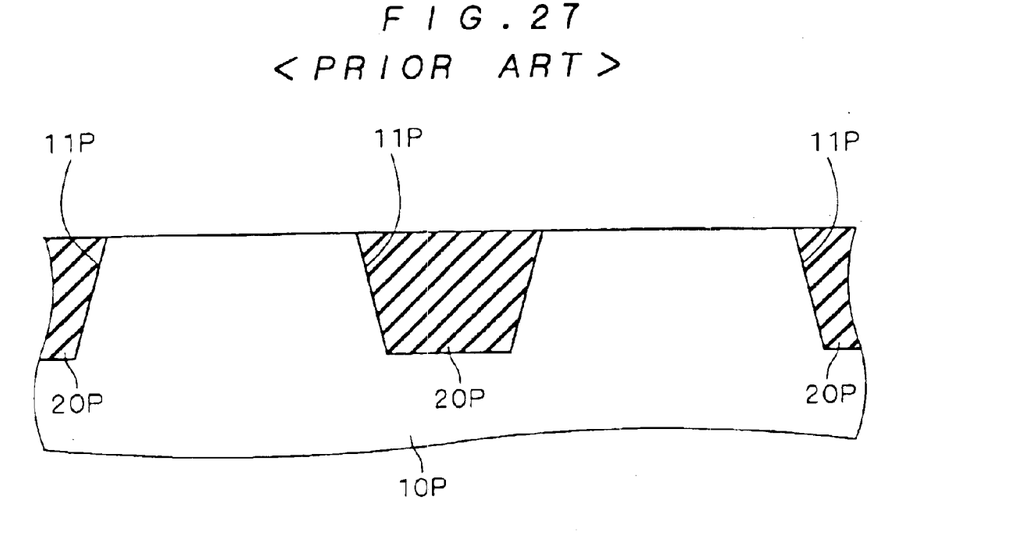
Figure 28:
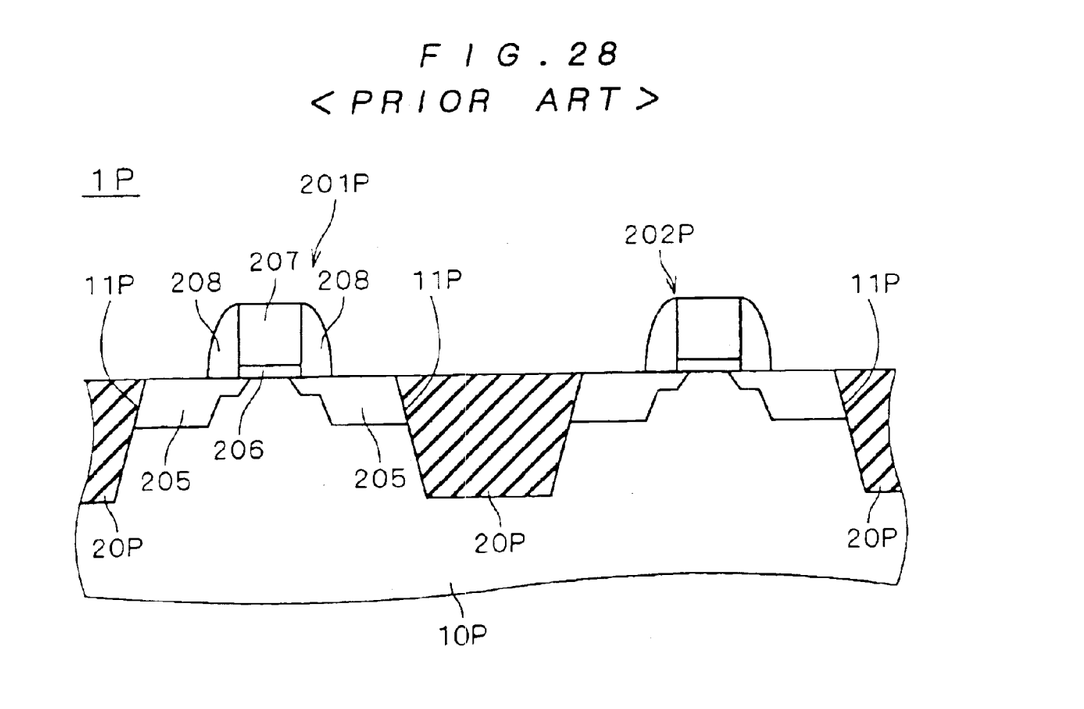

Thereafter, the silicon nitride film 222P is removed and the silicon oxide film 221P is removed using hydrofluoric acid. As a result, trench isolation is completed as illustrated in FIG. 27.

The next step is ion implantation for forming each well region, channel cut region and channel impurity layer for MOSFETs 201P and 202P. The channel impurity layer controls a threshold voltage of each MOSFET. Next, a gate insulating film 206, a polysilicon film 207 for forming a gate electrode, and a sidewall 208 are provided. Also provided is a source/drain diffusion layer 205 by ion implantation, thus completing a semiconductor device 1P (see FIG. 28).

As described, according to the background-art method, the buried oxide film 21P is entirely deposited by CVD, thus filling the trench 11P defined in the substrate 10P with the buried oxide film 21P.

The trench 11P will have a higher aspect ratio accompanied by increasing degree of shrinkage. Therefore, the foregoing step of filling the trench 11P generates a void in the trench 11P. After CMP and/or removal of the silicon oxide film 221P using hydrofluoric acid, such void appears on a surface of the silicon oxide film 20P, forming a minute recess. When an interconnect material for forming an upper interconnect layer is buried in such minute recess and remains therein, a short circuit may be developed in the interconnect layer. That is, generation of void results in the problem involving considerable reduction in yield of an element.

SUMMARY OF THE INVENTION

It is therefore a first object of the present invention to provide a method of manufacturing a semiconductor device allowing improvement in yield.

According to a first aspect of the present invention, the method of manufacturing a semiconductor device includes the following steps (a) through (e). The step (a) forms a first insulating film into a predetermined pattern on a substrate surface of a semiconductor substrate. The step (b) oxidizes an exposed substrate surface after the step (a) to obtain a first oxide film. The step (c) removes at least a part of the first oxide film. The step (d) epitaxially grows a first semiconductor film on the exposed substrate surface after the step (c). The step (e) polishes the first semiconductor film to an extent that an upper surface of the first semiconductor film is not more than an upper surface of the first insulating film in height.

After patterning for forming the first insulating film that provides an element isolation region, the first semiconductor film is epitaxially grown. Therefore, contrary to the background-art method including the step of filling a trench with an oxide film, there will no void to be generated in the element isolation region. As a result, it is allowed to compensate for reduction in yield caused by existence of void. Further, the steps of forming and removing the first oxide film (a so-called sacrificial oxidation process) are performed prior to growth of the first semiconductor film. Therefore, damage to the substrate surface caused in the step of patterning the first insulating film can be eliminated. Further, a clean surface can be obtained. As a result, crystal defects occurring at an interface between the semiconductor substrate and the first semiconductor film are suppressed, thus ensuring high quality of the first semiconductor film. Further, generation of junction leakage current resulting from such crystal defects can be suppressed, thereby allowing improvement in yield. Still further, the first semiconductor film is polished to an extent that the upper surface of the first semiconductor film is not more than the upper surface of the first insulating film in height. In an MISFET, it is therefore allowed to control concentration of electric field at a periphery of the upper surface of the first semiconductor film that is applied from a gate electrode. As a result, an MISFET relieving the problem resulting from such concentration of electric field can be manufactured with high yield.

It is a second object of the present invention to provide the method of manufacturing a semiconductor device allowing steps to be commonly performed in the element forming region and the alignment mark region.

According to a second aspect of the present invention, the method of manufacturing a semiconductor device includes the following steps (i) through (l). The step (i) forms an insulating film into a predetermined pattern on a substrate surface of a semiconductor substrate. The semiconductor substrate includes the element forming region and the alignment mark region. The step (j) epitaxially grows a semiconductor film on an exposed substrate surface after the step (i). The step (k) polishes the semiconductor film to an extent that an upper surface of the semiconductor film is not more than an upper surface of the insulating film in height. The step (l) increases a degree of a step height defined on an exposed surface in the alignment mark region to obtain an alignment mark after the step (k).

The steps (i) through (k) are commonly performed in the element forming region and the alignment mark region.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
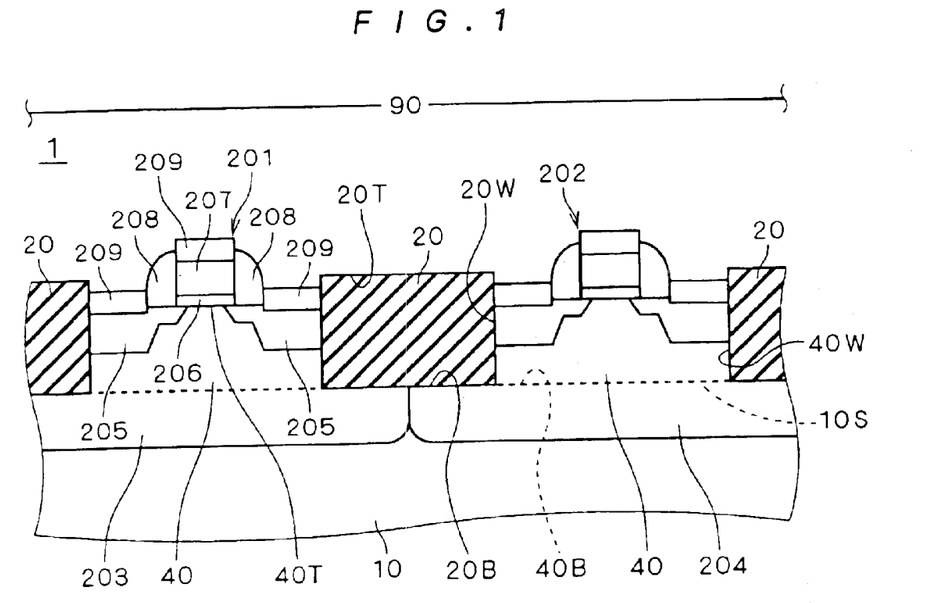
FIG. 1 is a sectional view illustrating a semiconductor device according to a first preferred embodiment of the present invention.

FIG. 1 is a sectional view illustrating the structure of an element forming region 90 of a semiconductor device 1 according to the first preferred embodiment of the present invention. The element forming region 90 is defined in the semiconductor device 1 on the way to completion (including a silicon substrate (or semiconductor substrate) 10 in a state before manufacture of the semiconductor device 1 is started) as well as in the completed semiconductor device 1. Further, the element forming region 90 is defined both as a two-dimensional region and as a three-dimensional region.

The semiconductor device 1 has the silicon substrate (or semiconductor substrate) 10, and a silicon film (or first semiconductor film) 4 and a silicon oxide film (or first insulating film) 20 each provided on a substrate surface 10S. In the element forming region 90, the silicon film 40 offers an active region. The silicon oxide film 20 provides an element isolation region or, in other words, it serves as element isolation. In the following description, a silicon oxide film may also be referred to simply as "oxide film".

The silicon film 40 has a surface (or lower surface) 40B contacting the substrate surface 10S, a surface 40T (or upper surface) facing the lower surface 40B, and a surface (or side surface) 40W defined between the surfaces 40B and 40T. Similar to the silicon film 40, the oxide film 20 has a surface (or lower surface) 20B contacting the substrate surface 10S, a surface (or upper surface) 20T facing the lower surface 20B, and a surface (or side surface) 20W defined between the surfaces 20B and 20T. The side surface 40W of the silicon film 40 and the side surface 20W of the oxide film 20 are in contact with each other.

The semiconductor device 1 includes a PMOSFET (or PMISFET) 201 and an NMOSFET (or NMISTEF) 202 in the active region. More particularly, a gate insulating film 206 and a polysilicon film 207 are stacked in this order on the upper surface 40T of the silicon film 40. Further, an N-well impurity layer 203 is provided extending from the upper surface 40T of the silicon film 40 to a part of the substrate 10. Provided in the upper surface 40T of the silicon film 40 are diffusion layers 205 serving as source/drain regions defined on both sides of a channel region under the gate insulating film 206. Further provided are silicide films (or tungsten silicide films, for example) 209 on the diffusion layers 205 and on the polysilicon film 207. The polysilicon film 207 alone or a stacked structure including the polysilicon film 207 and the silicide film 209 serves as a gate electrode. Further, a sidewall 208 is provided to be in contact with each side surface of the gate insulating film 206, the polysilicon film 207, and the silicide film 209.

Following the structure of the PMOSFET 201, the NMOSFET 202 is provided corresponding to a P-well impurity layer 204 also having the same structure as the above-described N-well impurity layer 203.

Next, with reference to sectional views of FIGS. 1 through 7, the method of manufacturing the semiconductor device 1 will be described.

Figure 2:
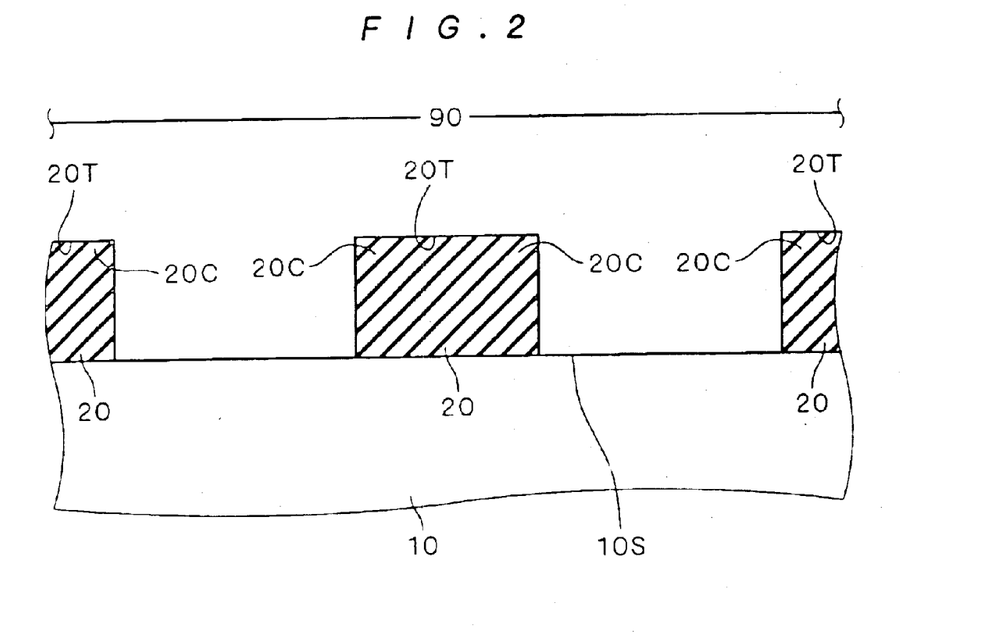
FIGS. 2 through 7 are sectional views illustrating a method of manufacturing a semiconductor device according to the first preferred embodiment of the present invention.

First, the substrate 10 is prepared. Then the substrate surface 10S is thermally oxidized, to form an oxide film to an exemplary thickness ranging between 100 nm and 500 nm. This oxide film is thereafter patterned using photolithography and anisotropic etching so that the substrate surface 10S defined in the active region is exposed. The oxide film 20 (or first insulating film) is thereby formed as illustrated in FIG. 2.

Figure 3:
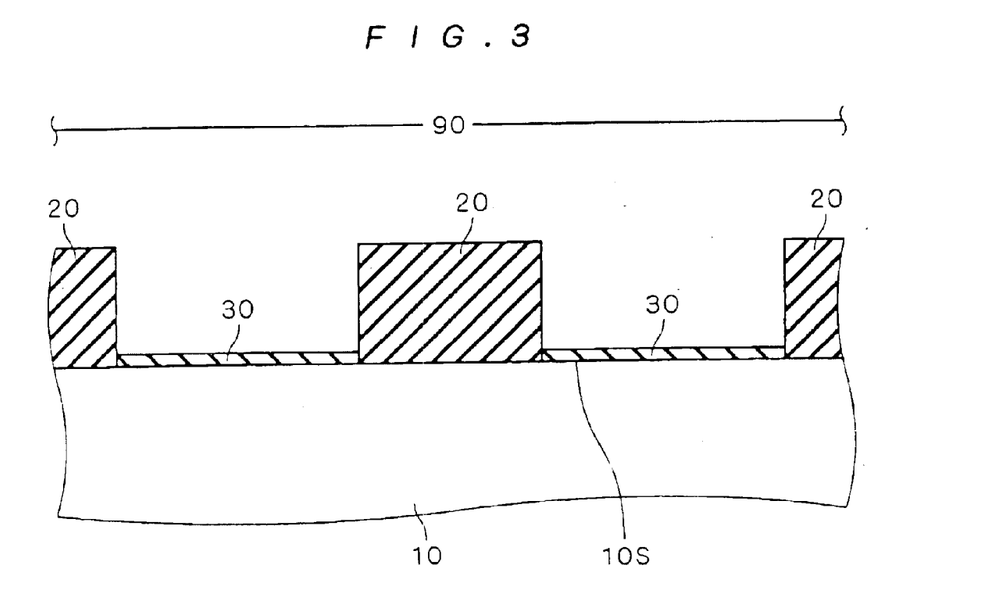

The next step is thermal oxidation of an exposed substrate surface 10S, to form a thermal oxide film (or first oxide film) 30 to an exemplary thickness ranging between 10 nm and 30 nm as illustrated in FIG. 3. The thermal oxide film 30 is thereafter removed using hydrofluoric acid so that the substrate surface 10S defined in the active region is exposed again. Following the steps of forming the thermal oxide film 30 and removing the same, damage to the substrate surface 10S caused in the step of patterning the oxide film 20 can be reduced or even eliminated. Further, a clean surface can be obtained.

Figure 4:
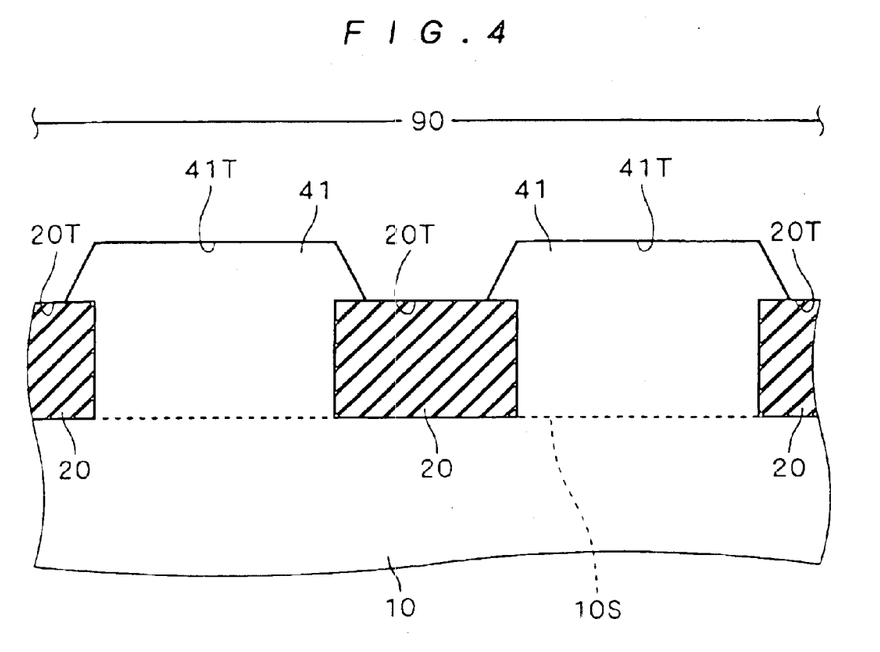

Thereafter, a silicon film (or first semiconductor film) 41 is epitaxially grown on the exposed substrate surface 10S (namely, the silicon film 41 is grown by selective epitaxial growth). The silicon film 41 should be such that it is larger in thickness than the oxide film 20. Alternatively, an upper surface 41T of the silicon film 41 should be greater in height than the upper surface 20T of the oxide film 20.

Figure 5:
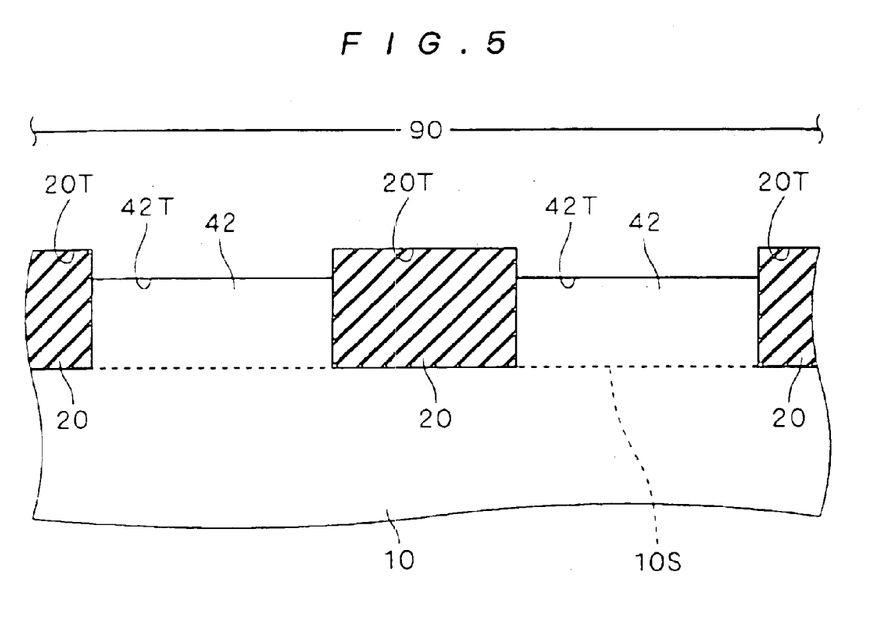

Subsequent to this, the silicon film 41 is polished using CMP, for example, to form a silicon film (or first semiconductor film) 42 as illustrated in FIG. 5. At this time, polishing conditions such as selection of polishing agent are established in such a manner that the speed in polishing the silicon film is higher than the speed in polishing the oxide film. Due to over polishing, further, an exposed surface (or upper surface) 42T of the silicon film 42 after polishing is not more than the exposed surface (or upper surface) 20T of the oxide film 20 in height.

Figure 6:
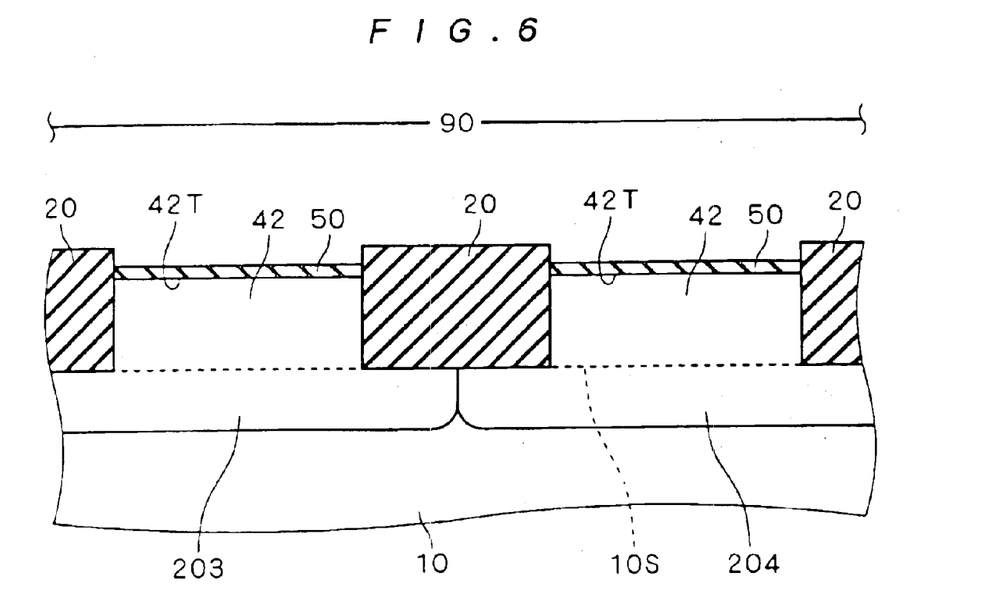

Thereafter the surface 42T of the silicon film 42 is thermally oxidized, to form a thermal oxide film (or second oxide film) 50 to an exemplary thickness ranging between 10 nm and 30 nm as illustrated in FIG. 6.

Next, boron ions are implanted into the active region for forming the NMOSFET 202 at an acceleration energy ranging from 200 KeV to 1 MeV, to form the P-well impurity region 204 (see FIG. 6). Boron ions are further implanted at an acceleration energy ranging from 100 keV to 300 keV, to form a channel cut impurity layer (not shown) under the oxide film 20. Boron ions are also implanted at an acceleration energy from 10 keV to 100 keV, to form a channel impurity layer (not shown) for controlling a threshold voltage of the NMOSFET 202.

On the other hand, phosphorous ions are implanted into the active region for forming the PMOSFET 201 at an acceleration energy ranging from 300 keV to 2 MeV, to form the N-well impurity layer 203 (see FIG. 6). Phosphorous ions are further implanted at an acceleration energy ranging from 200 keV to 600 keV, to form a channel cut impurity layer (not shown) under the oxide film 20. Phosphorous or arsenic ions are also implanted at an acceleration energy from 10 keV to 100 keV, to form a channel impurity layer (not shown) for controlling a threshold voltage of the PMOSFET 201.

The thermal oxide film 50 is thereafter removed using hydrofluoric acid. The element isolation structure is thereby completed. Following the steps of forming the thermal oxide film 50 and removing the same, damage to the surface 42T of the silicon film 42 caused in the step of polishing can be reduced or even eliminated. Further, a clean surface can be obtained. The silicon film 42 defined after removal of the thermal oxide film 50 corresponds to the aforementioned silicon film 40.

Figure 7:
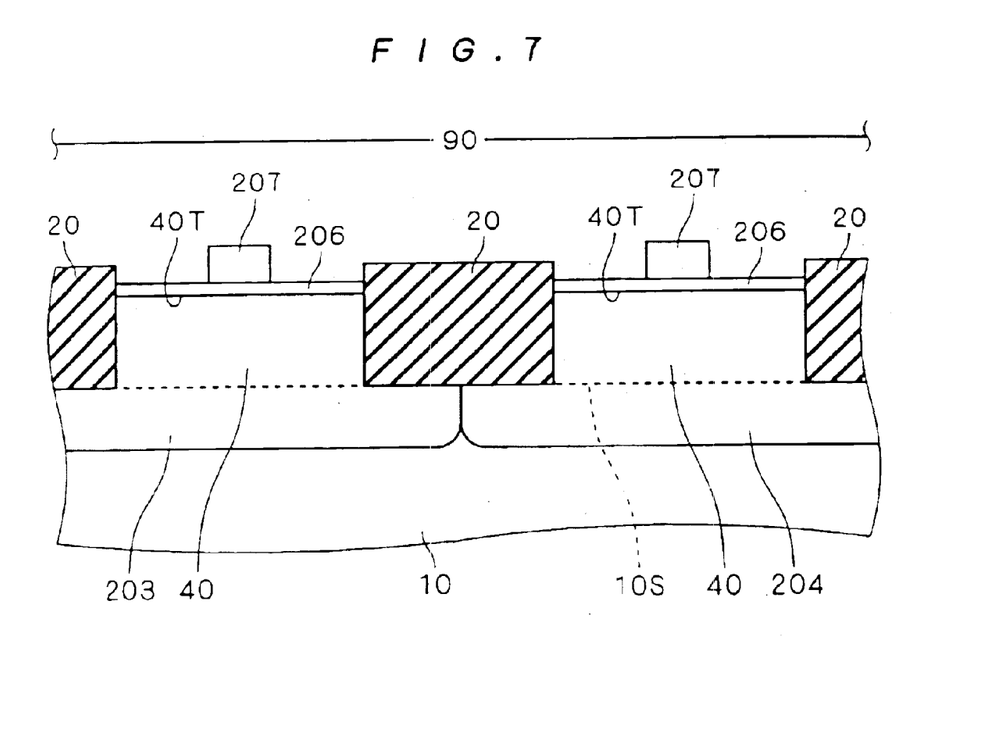

The next step is thermal oxidation of the surface 40T of the silicon film 40, to form the gate insulating film 206 to an exemplary thickness ranging between 1 nm and 10 nm. Subsequently, a polysilicon film is deposited by CVD to an exemplary thickness ranging between 100 nm and 250 nm, which is thereafter patterned by photolithography and anisotropic etching. As a result, the polysilicon film 207 is formed as illustrated in FIG. 7.

Following ion implantation using a resist mask, a pocket layer and an extension layer are each provided in the regions for forming the PMOSFET 201 and the NMOSFET 202. The sidewall 208 is provided to be in contact with the side surface of the polysilicon film 207. Thereafter provided are the diffusion layer 205 by ion implantation, and the silicide films 209 by salicidation on the polysilicon film 207 and the diffusion layer 205. The semiconductor device 1 as illustrated in FIG. 1 is thereby completed.

The semiconductor device 1 may alternatively include a metal gate electrode formed by dummy gate process and damascene process.

According to the method of the first preferred embodiment, after patterning for forming the oxide film 20 that provides an element isolation region, the silicon film 41 is epitaxially grown. Therefore, contrary to the background-art method including the step of filling the trench 11P with the oxide film 21P (trench isolation technique), there will be no void to be generated in the element isolation region. As a result, problems such as a short circuit in an interconnect layer due to existence of void can be prevented, thus allowing improvement in yield.

Further, the steps of forming and removing the thermal oxide film 30 (a so-called sacrificial oxidation process) are performed prior to growth of the silicon film 41. Therefore, damage to the substrate surface 10S caused in the step of etching the oxide film 20 can eliminated. Further, a clean surface can be obtained. As a result, crystal defects such as misfit occurring at an interface between the substrate 10 and the silicon film 40 are suppressed, thus ensuring high quality of the silicon film 40. These crystal defects occur at the vicinity of the region defined under the oxide film 20. Therefore, the method according to the first preferred embodiment is still advantageous in that generation of junction leakage current between adjacent elements (between the MOSFETs 201 and 202, for example) can be suppressed. That is, improvement in yield is allowed.

Still further, the silicon film 41 is polished to an extent that the upper surface 42T of the silicon film 42 is not more than the upper surface 20T of the oxide film 20 in height. Therefore, it is allowed to control concentration of electric field at the periphery of the upper surface 40T of the silicon film 40 that is applied from each gate electrode of the MOSFETs 201 and 202. The concentration of electric field may result in the problems such as generation of hump in I-V characteristic of a transistor and decrease in threshold voltage accompanied by reduction in channel width (inverse narrow channel effect). According to the first preferred embodiment, the MOSFETs 201 and 202 relieving these problems can be manufactured with high yield. Further, suppression of hump as mentioned leads to reduction in leakage current, thus offering another advantage that power consumption is reduced.

As the silicon film 41 grows in thickness during its selective epitaxial growth on the exposed substrate surface 10S, facet may occur. According to the method of the first preferred embodiment, however, an uppermost layer of the silicon film 41 having a high probability of facet to be generated therein is polished and removed. As a result, high quality of the silicon films 42 and 40 can be ensured.

Yet further, following the steps of forming and removing the thermal oxide film 50 (a so-called sacrificial oxidation process), damage to the silicon film 42 caused in the polishing step (generation of defects such as scratch and generation of foreign materials, for example) can be eliminated. Therefore, a high quality of a device element (such as gate insulating film 206 obtained by thermal oxidation of the upper surface of the silicon film 40) is ensured, thus allowing improvement in yield.

<First Modification of First Preferred Embodiment>

The method according to the first modification of the first preferred embodiment does not follow the foregoing steps of providing the thermal oxide film 50 and removing the same. However, the first modification of the first preferred embodiment still allows damage to the surface 42T of the silicon film 42, that has been caused in the polishing step, to be reduced or even eliminated. After the polishing step by CMP (see FIG. 5), the exposed surface (or upper surface) 42T of the silicon film 42 undergoes thermal processing (annealing) in an atmosphere including hydrogen as seen from the sectional view of FIG. 8 in a 800 to 1200° C. temperature range.

Figure 8:
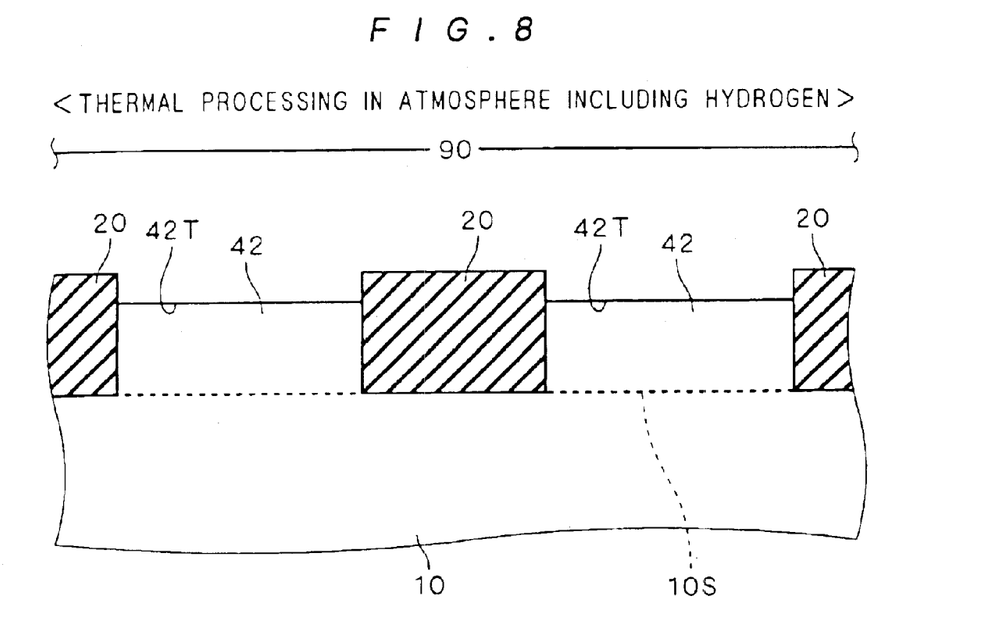
FIG. 8 is a sectional view illustrating a method of manufacturing a semiconductor device according to a first modification of the first preferred embodiment of the present invention.

Following this thermal processing, silicon atoms in the surface 42T of the silicon film 42 move to be rearranged. Therefore, damage to the silicon film 42 caused in the polishing step can be eliminated. As a result, a high quality of a device element (such as gate insulating film 206) is ensured, thus allowing improvement in yield.

The silicon film 42 obtained after the foregoing thermal processing corresponds to the aforementioned silicon film 40.

<Second Modification of First Preferred Embodiment>

The method according to the second modification of the first preferred embodiment does not follow the foregoing steps of providing the thermal oxide film 50 and removing the same. Instead, after the polishing step by CMP (see FIG. 5), a silicon film (or second semiconductor film) 60 is epitaxially grown on the exposed surface (or upper surface) 42T of the silicon film 40 to an exemplary thickness ranging between 10 nm and 30 nm as seen from the sectional view of FIG. 9. That is, the silicon film 60 is smaller in thickness than the silicon films 42 and 40. The silicon films 42 and 60 may be generically referred to as the silicon film 40. Therefore, after formation of the silicon film 60, the same steps as those in the first preferred embodiment can be also followed in the second modification.

Figure 9:
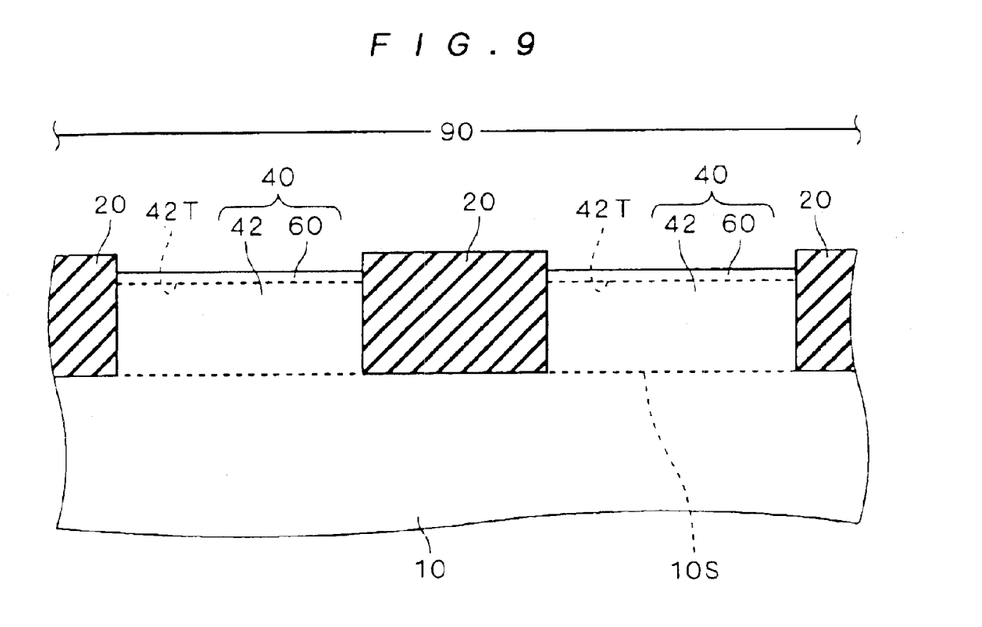
FIG. 9 is a sectional view illustrating a method of manufacturing a semiconductor device according to a second modification of the first preferred embodiment of the present invention.

As the silicon film 40 grows in thickness during its selective epitaxial growth on the exposed substrate surface 10S, facet may occur. According to the method of the second modification, however, an uppermost layer of the silicon film 41 having a high probability of facet to be generated therein is polished. The silicon film 60 is thereafter provided. Further, the silicon film 60 is smaller in thickness than the silicon films 42 and 41. Therefore, the probability of occurrence of facet is lower in the silicon film 60 than in the silicon film 41. As a result, the silicon film 60 is capable of providing an active region having a high film quality.

Further, the silicon films 42 and 60 may be defined to have different doping levels. For example, the silicon film 42 may be a doped film while the silicon film 60 may be a non-doped film. The resultant impurity profile can therefore be steep, eventually producing the effect that a threshold voltage of a transistor can be easily controlled, for example.

<Third Modification of First Preferred Embodiment>

Figure 10:
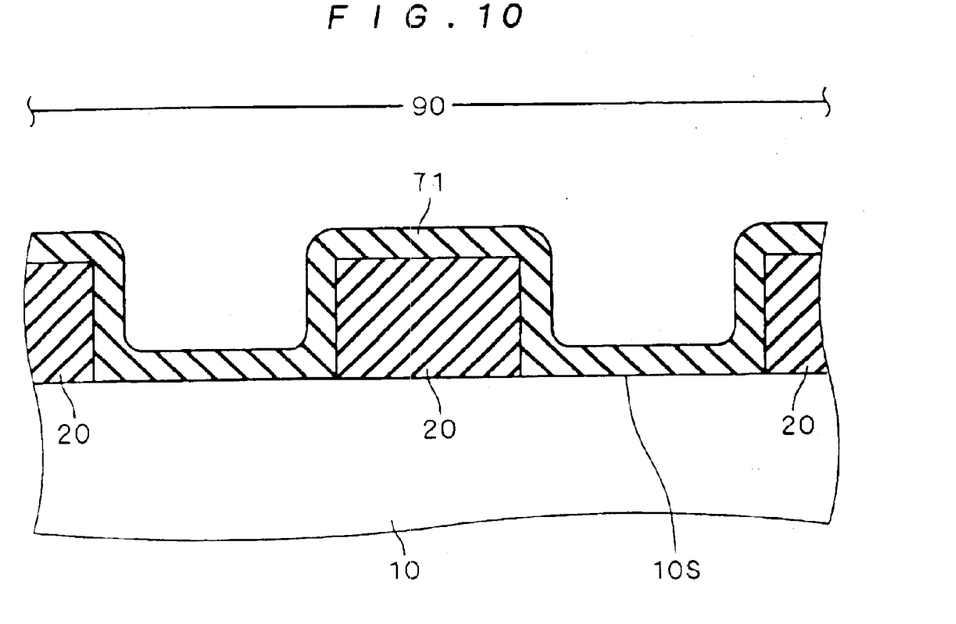
FIGS. 10 through 14 are sectional views illustrating a method of manufacturing a semiconductor device according to a third modification of the first preferred embodiment of the present invention.
Figure 11:
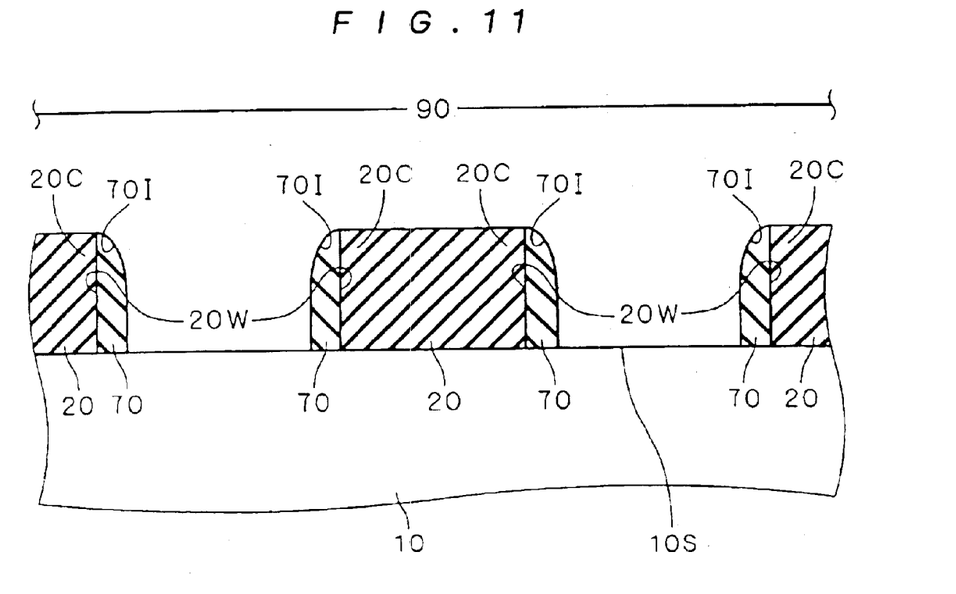
Figure 12:
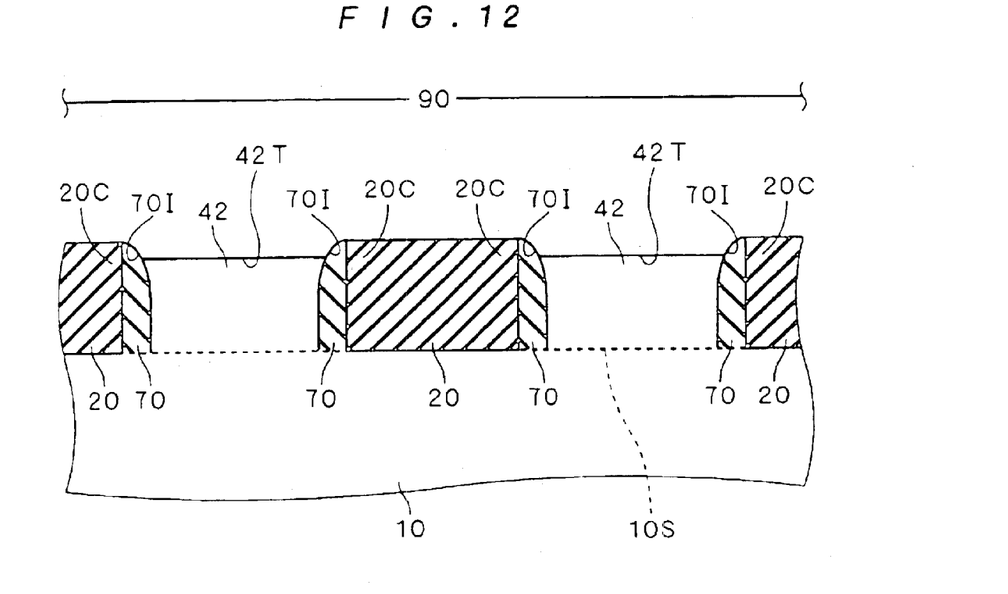

FIGS. 10 through 12 are sectional views illustrating the manufacturing method according to the third modification of the first preferred embodiment. As illustrated in FIG. 10, the oxide film 20 formed by patterning is entirely covered with an oxide film (or second insulating film) 71. The oxide film 71 is deposited by CVD, growing to an exemplary thickness ranging between 10 nm and 50 nm. Thereafter the oxide film 71 is etched back by anisotropic etching, to form an oxide film (or second insulating film) 70 contacting the side surface 20W of the oxide film 20 and the substrate surface 10S as illustrated in FIG. 11. The oxide film 70 has a sidewall-like shape, namely, the oxide film 70 is of a shape similar to that of the sidewall 208.

Resulting from its sidewall-like shape, the oxide film 70 has a slanting surface 70I extending from the upper surface 20T of the oxide film 20 while facing the side surface 20W of the oxide film 20. That is, after the oxide film 70 is formed, the slanting surface 70I is defined at a position corresponding to a corner 20C of the oxide film 20 on the side of an entrance to an opening.

The next step is thermal oxidation of the exposed substrate surface 10S, to form the thermal oxide film 30 to an exemplary thickness ranging between 10 nm and 30 nm (see FIG. 3). The thermal oxide film 30 is thereafter removed using hydrofluoric acid. Then following the foregoing manufacturing method, the silicon film 41 is epitaxially grown on the exposed substrate surface 10S (see FIG. 4). Thereafter the silicon film 41 is polished to obtain the silicon film 42 (see FIG. 12). Subsequent to this, the same steps as those in the first preferred embodiment can be also followed in the third modification of the first preferred embodiment.

According to the third modification of the first preferred embodiment, the upper surface 42T of the silicon film 40 is defined to contact the slanting surface 70I of the oxide film 70. The silicon film 42 provided on the slanting surface 70I will have a smaller thickness as it gets nearer to a periphery (that is, to the slanting surface 70I). Therefore, when a device element such as the gate insulating film 206 is to be formed, thinning can be suppressed. Here, thinning means a phenomenon in which the gate insulating film 206 is reduced in thickness at the periphery of the upper surface 40T of the silicon film 40. As a result, a high quality of the gate insulating film 206 can be ensured, thus allowing improvement in yield.

Suppression of thinning produces another effect. That is, at the periphery of the silicon film 40, it is allowed to suppress increase in intensity (concentration) of electric field applied from the gate electrode 206. The concentration of electric field may result in the foregoing problems such as generation of hump and inverse narrow channel effect. Therefore, according to the method of the third modification of the first preferred embodiment, the MOSFETs 201 and 202 relieving these problems can be manufactured with high yield. Further, suppression of hump as mentioned leads to reduction in leakage current, thus offering another advantage that power consumption can be reduced.

Figure 13:
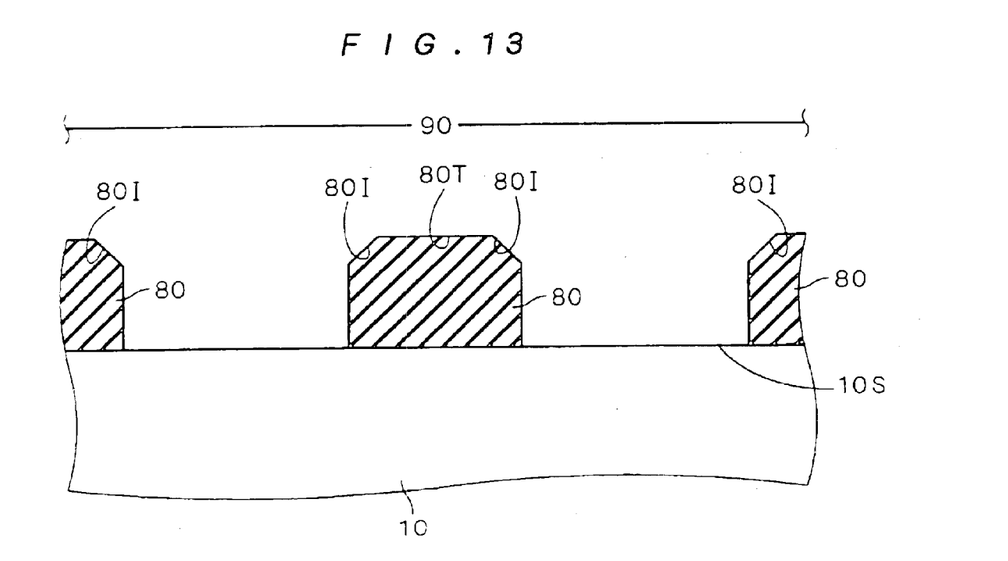

Alternatively, the oxide film 20 formed by patterning may be subjected to sputter etching, to form an oxide film (or first insulating film) 80 from the oxide film 20 (FIG. 13). According to sputter etching, etching rate is higher at the corner 20C (see FIG. 2) than at the surface 20T. Therefore, the corner 20C is cut away. The resultant structure of the oxide film 80 is such that a surface (or upper surface) 80T, and a slanting surface 80I extending from the surface 80T are defined. That is, by etching the corner 20C of the oxide film 20, the slanting surface 80I is defined at a position corresponding to the corner 20C of the oxide film 20.

Thereafter the oxide film 30 is formed and then removed (see FIG. 3). Then following the foregoing manufacturing method, the silicon film 41 is epitaxially grown (see FIG. 4). Thereafter the silicon film 41 is polished to obtain the silicon film 42 (see FIG. 14). Subsequent to this, the same steps as those in the first preferred embodiment can be also followed.

Figure 14:
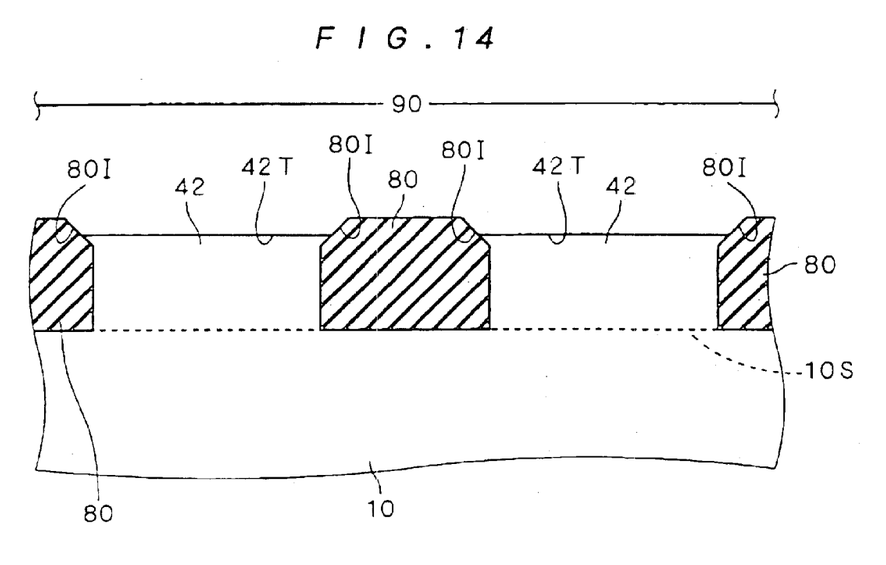

The slanting surface 80I produces the same effects as obtained by the slanting surface 70I described above. Further, the slanting surface 80I can be formed following the lessened number of steps as compared with the slanting surface 70I.

<Second Preferred Embodiment>

In the steps of manufacturing the semiconductor device, an alignment mark is to be generally provided on the substrate 10. In the second preferred embodiment of the present invention, a method of forming an alignment mark is given utilizing the foregoing manufacturing method. FIGS. 15 through 19 are sectional views illustrating the manufacturing method according to the second preferred embodiment.

Figure 15:
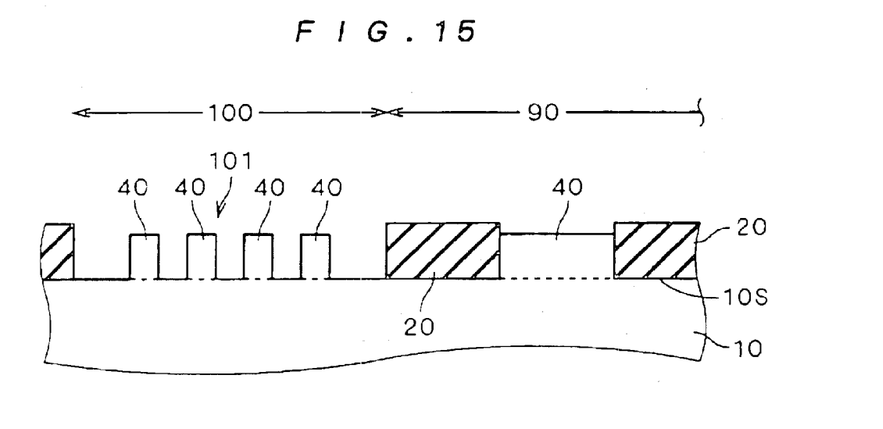
FIGS. 15 through 19 are sectional views illustrating a method of manufacturing a semiconductor device according to a second preferred embodiment of the present invention.

As illustrated in FIG. 15, the substrate 10 includes the element forming region 90 and an alignment mark region 100. Similar to the element forming region 90, the alignment mark region 100 is defined in the completed semiconductor device 1 as well as in the semiconductor device 1 on the way to completion (including the substrate 10 in the state before manufacture of the semiconductor device 1 is started). Further, the alignment mark region 100 is defined as both a two-dimensional region and a three-dimensional region. The alignment mark region 100 includes a patterned silicon film 40 provided on the substrate surface 10S. This silicon film 40 and the substrate 10 (more particularly, the substrate surface 10S) defines a step height, which will serve as an alignment mark 101. Patterns of the alignment mark 101 and an alignment mark to be described later in plan view may be arbitrarily determined. The method of forming the alignment mark 101 will be given below.

Figure 16:
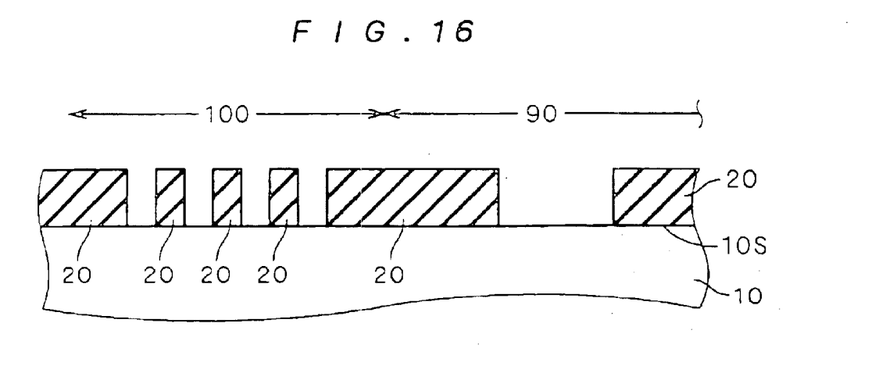

First, the semiconductor substrate 10 is prepared. Then the substrate surface 10S is thermally oxidized, to form an oxide film in the element forming region 90 and the alignment mark region 100 growing to an exemplary thickness ranging between 100 nm and 500 nm. This oxide film is thereafter patterned in the element forming region 90 and the alignment mark region 100. The oxide film 20 is thereby formed as illustrated in FIG. 16. More particularly, in the alignment mark region 100, the oxide film 20 is provided in an opening defined by the silicon film 40 and the substrate 10 of the to-be-formed alignment mark 101.

Figure 17:
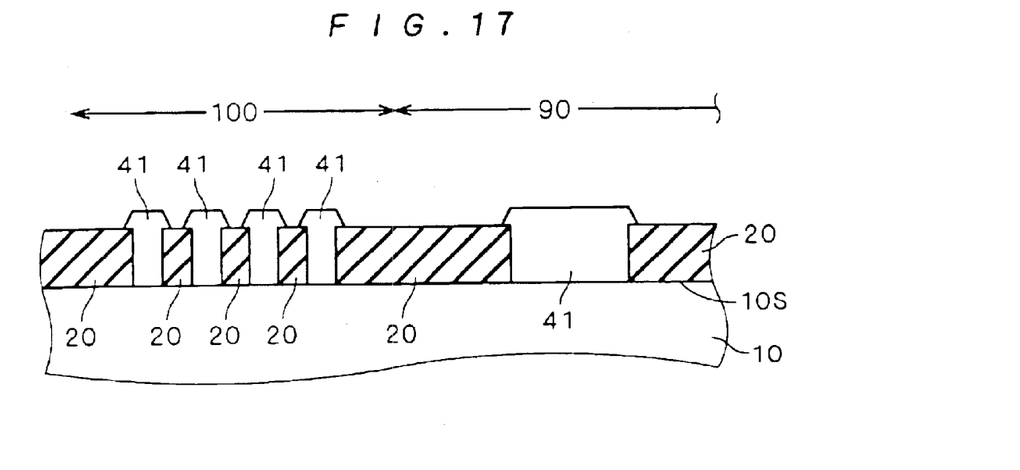
Figure 18:
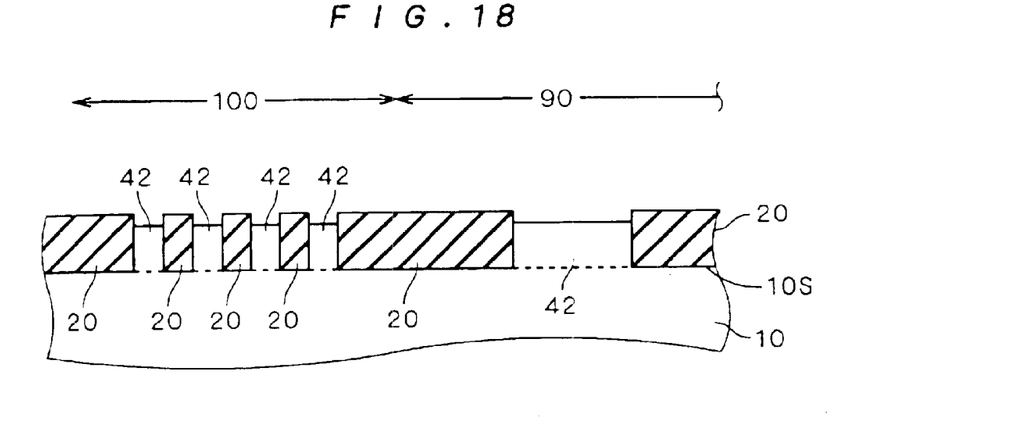

The next step is thermal oxidation of the substrate surface 10S exposed in the element forming region 90 and the alignment mark region 100, to form the thermal oxide film 30 (see FIG. 3). The thermal oxide film 30 is thereafter removed. Subsequently, the silicon film 41 is epitaxially grown on the exposed substrate surface 10S in the element forming region 90 and the alignment mark region 100 as illustrated in FIG. 17. Then the silicon film 41 is polished to obtain the silicon film 42 (see FIG. 18).

Figure 19:
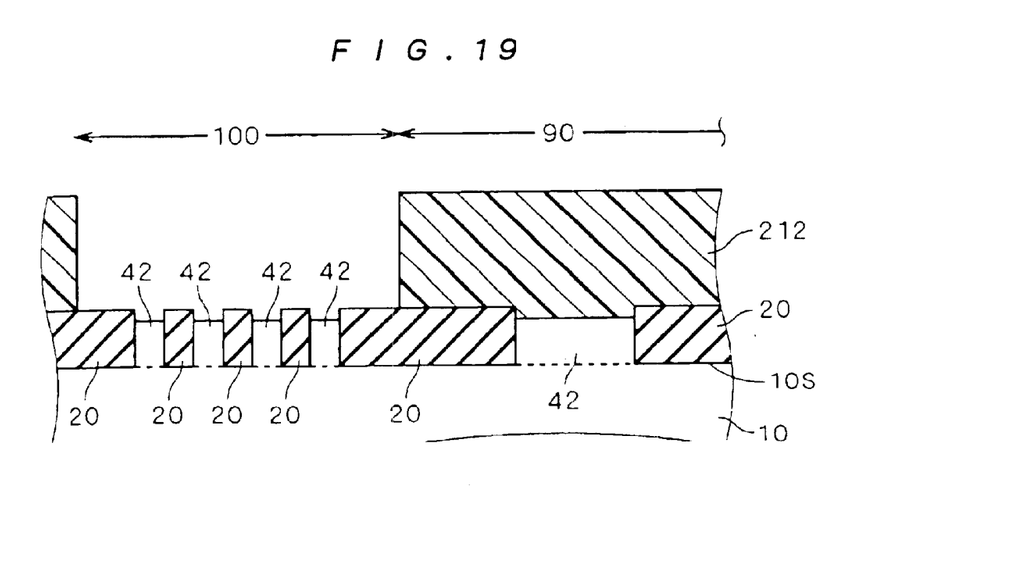

Thereafter, the second preferred embodiment characteristically provides a resist 212 using photolithography. The resist 212 has an opening in the alignment mark region 100 as illustrated in FIG. 19. Next, following wet etching using hydrofluoric acid and/or dry etching, the oxide film 20 in the alignment mark region 100 is removed. The alignment mark 101 given in FIG. 15 is thereby obtained. During this etching process, the oxide film 20 may partially remain in the alignment mark region 100. In this case, the alignment mark 101 is a step height defined by the oxide film 20 and the residual silicon film 42.

The resist 212 is removed after formation of the alignment mark 101. Thereafter the same steps as those in the manufacturing method according to the first preferred embodiment are followed, to complete the semiconductor device 1.

The alignment mark 101 may be utilized in the photolithography process for patterning the polysilicon film 207 for constituting a gate electrode.

The manufacturing method according to the second preferred embodiment requires removal of the oxide film 20. Therefore, the step height for forming the alignment mark 101 on the exposed surface in the alignment mark region 100 is allowed to have a greater degree than that defined after polishing process. Further, the element forming region 90 and the alignment mark region 100 undergo a number of common steps (such as those starting from formation of the oxide film 20 until polishing). Therefore, the alignment mark 101 can be easily formed.

The alignment mark 101 is defined by the step height having a degree approximately the same as the thickness of the oxide film 20 (namely, the thickness ranging between 100 nm and 500 nm as described). Therefore, a signal obtained from the alignment mark region 100 can be clearly identified, thus resulting in improvement in alignment accuracy and eventually, resulting in improvement in yield. Improvement in alignment accuracy also leads to decrease in alignment margin, thus producing the exemplary effect that areas for forming devices such as MOSFETs 201 and 202 can be reduced. As a result, a larger number of chips can be provided on one wafer.

<First Modification of Second Preferred Embodiment>

Figure 20:
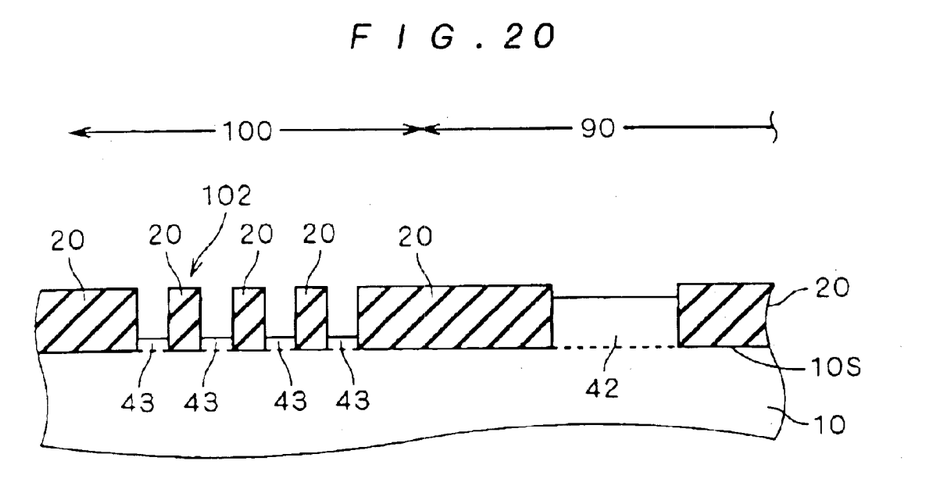
FIG. 20 is a sectional view illustrating a method of manufacturing a semiconductor device according to a first modification of the second preferred embodiment of the present invention.

After the resist 212 is provided as given in FIG. 19, the method according to the first modification of the second preferred embodiment does not follow the step of removing the oxide film 20. Instead, as the sectional view of FIG. 20 illustrates, the silicon 42 in the alignment mark region 100 is partially removed by wet etching or dry etching. A step height thereby defined by a residual silicon film 43 and the oxide film 20 in the alignment mark region 100 serves as an alignment mark 102. Thereafter the same steps as those in the method according to the first preferred embodiment are followed, to complete the semiconductor device 1.

Alternatively, the silicon film 42 in the alignment mark region 100 may be totally removed so that the substrate surface 10S is exposed. In this case, the alignment mark 102 is a step height defined by the substrate 10 (more particularly, the substrate surface 10S) and the oxide film 20. Still alternatively, etching may be extended to the substrate 10 (more particularly, to the substrate surface 10S). In this case, the alignment mark 102 is a step height defined by the substrate 10 and the oxide film 20. The method according to the first modification of the second preferred embodiment produces the same effects as obtained by the above-described second preferred embodiment.

<Second Modification of Second Preferred Embodiment>

Figure 21:
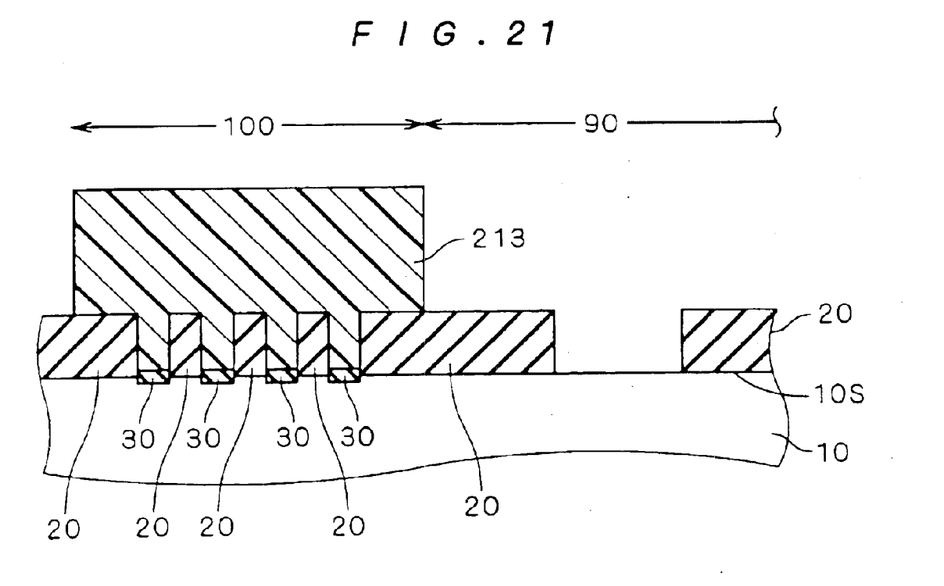
FIGS. 21 through 23 are sectional views illustrating a method of manufacturing a semiconductor device according to a second modification of the second preferred embodiment of the present invention.
Figure 22:
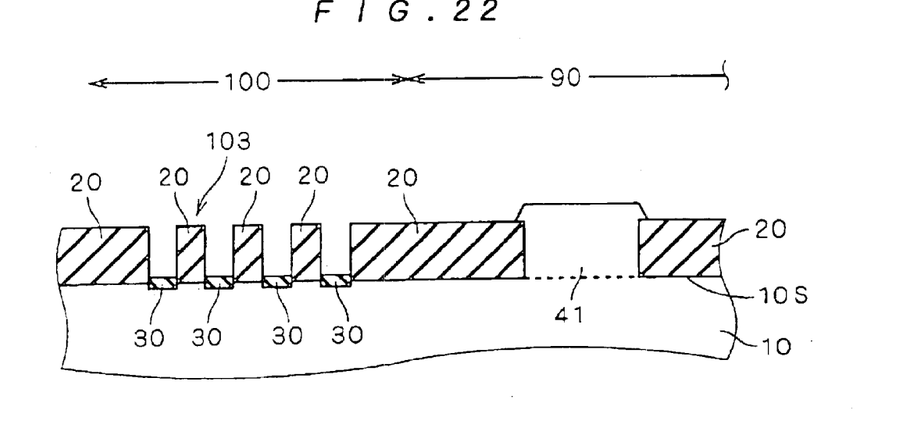
Figure 23:
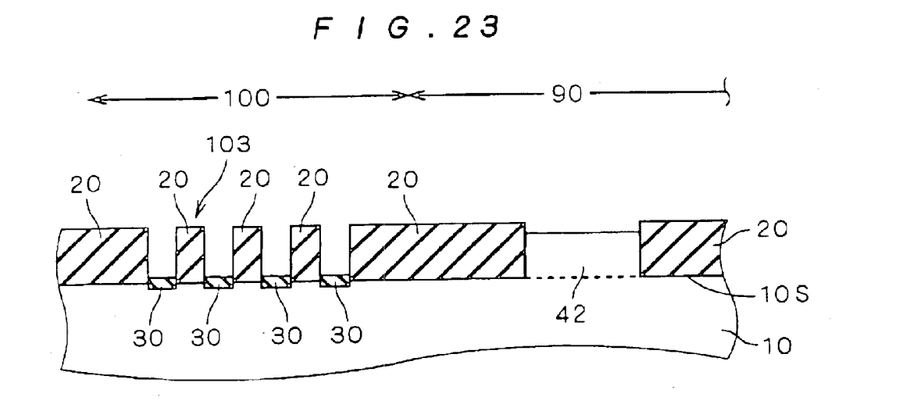
Figure 24:
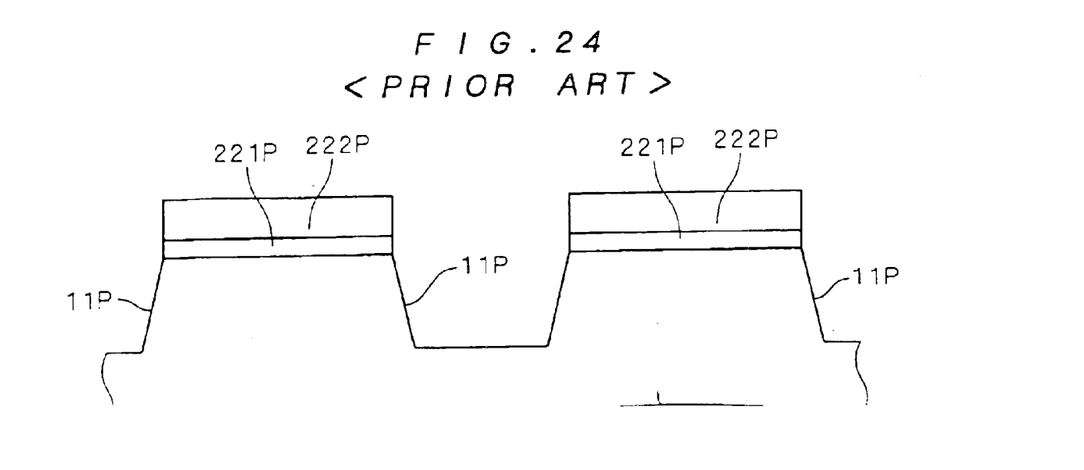
FIGS. 24 through 28 are sectional views illustrating a method of manufacturing a semiconductor device in the background art.
Figure 25:
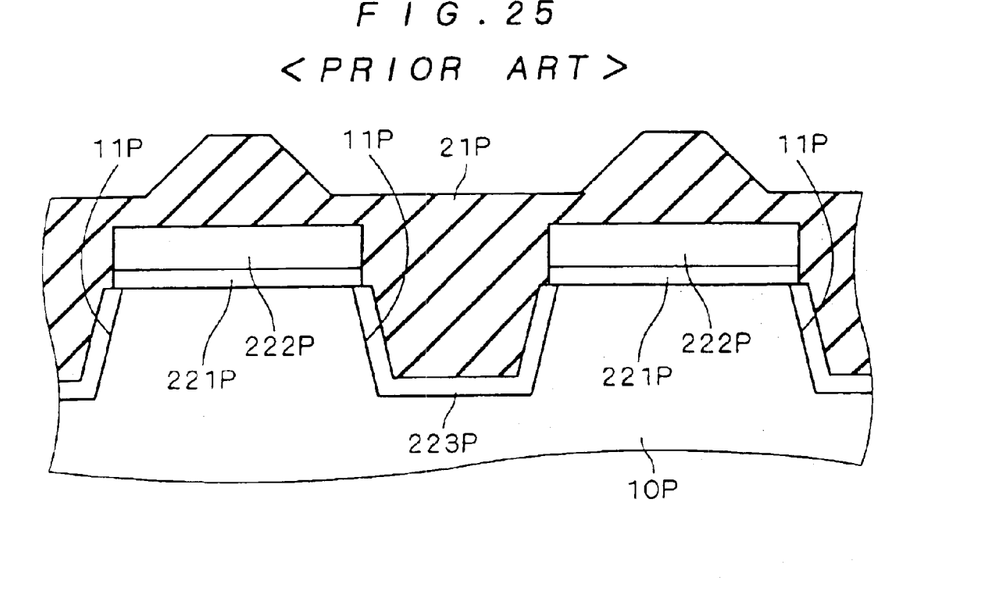
Figure 26:
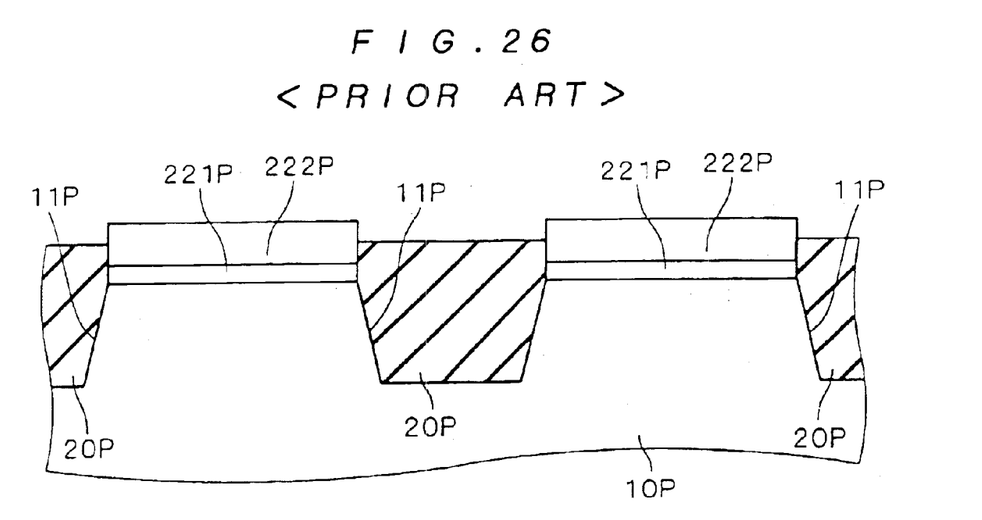

FIGS. 21 through 23 are sectional views illustrating the manufacturing method according to the second modification of the second preferred embodiment. According to the second modification of the second preferred embodiment, after the thermal oxide film 30 is provided in the element forming region 90 and the alignment mark region 100 (see FIG. 3), a resist 213 is provided to cover the oxide film 20 and the thermal oxide film 30 in the alignment mark region 100 as illustrated in FIG. 21. Thereafter the thermal oxide film 30 in the element forming region 90 is removed as given in FIG. 21. That is, using the resist 213, the thermal oxide film 30 is removed in the element forming region 90 while it remains in the alignment mark region 100.

After the resist 213 is removed, the silicon film 41 is epitaxially grown on the exposed substrate surface 10S as illustrated in FIG. 22. Similar to the first preferred embodiment, the element forming region 90 includes the silicon film 41 provided therein. Besides, the alignment mark region 100 is covered with the oxide films 20 and 30, causing no exposure of the substrate surface 10S therein. Therefore, there occurs no growth of the silicon film 41 in the alignment mark region 100. Thereafter the silicon film 41 is polished to obtain the silicon film 42 (see FIG. 23). Thereafter the same steps as those in the method according to the first preferred embodiment are followed, to complete the semiconductor device 1.

According to the method of the second modification of the second preferred embodiment, a step height defined by the oxide films 20 and 30 serves as an alignment mark 103. The method according to the second modification of the second preferred embodiment produces the same effects as obtained by the above-described second preferred embodiment.

In the description given above, silicon and silicon oxide have been utilized as exemplary materials. In the foregoing manufacturing method, other type of semiconductor material and insulating material may be alternatively utilized.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (i) forming a insulating film into a predetermined pattern on a substrate surface of a semiconductor substrate, said semiconductor substrate including an element forming region and an alignment mark region,
   (j) epitaxially growing a semiconductor film on an exposed substrate surface after said step (i);
   (k) polishing said semiconductor film to an extent that an upper surface of said semiconductor film is not more than an upper surface of said insulating film in height; and
   (l) after said step (k), increasing a degree of a step height defined on an exposed surface in said alignment mark region to obtain an alignment mark.

2. The method according to claim 1, wherein said step includes the step of:
   (l-1) removing at least a part of said insulating filming said alignment mark region.

3. The method according to claim 1, wherein said step (l) includes the step of:
   (l-2) removing at least a part of said semiconductor film in said alignment mark region.

* * * * *